United States Patent
Galy et al.

(10) Patent No.: US 9,614,367 B2
(45) Date of Patent: Apr. 4, 2017

(54) ELECTRONIC DEVICE FOR ESD PROTECTION

(71) Applicant: STMicroelectronics SA, Montrouge (FR)

(72) Inventors: Philippe Galy, Le Touvet (FR); Johan Bourgeat, Saint Pierre d'allevard (FR)

(73) Assignee: STMicroelectronics SA, Montrouge (FR)

( * ) Notice: Subject to any disclaimer, the term of this patent is extended or adjusted under 35 U.S.C. 154(b) by 400 days.

(21) Appl. No.: 14/475,683

(22) Filed: Sep. 3, 2014

(65) Prior Publication Data

US 2015/0077888 A1   Mar. 19, 2015

(30) Foreign Application Priority Data

Sep. 13, 2013   (FR) ..................... 13 58846

(51) Int. Cl.
| | |
|---|---|
| H02H 9/00 | (2006.01) |
| H02H 9/04 | (2006.01) |
| H01L 27/02 | (2006.01) |
| H01L 29/74 | (2006.01) |

(52) U.S. Cl.
CPC ......... H02H 9/046 (2013.01); H01L 27/0262 (2013.01); H01L 27/0277 (2013.01); H01L 29/7436 (2013.01); H02H 9/044 (2013.01)

(58) Field of Classification Search
USPC .......................................................... 361/56
See application file for complete search history.

(56) References Cited

U.S. PATENT DOCUMENTS

| | | | |
|---|---|---|---|
| 5,615,073 A | 3/1997 | Fried et al. | |
| 5,811,857 A | 9/1998 | Assaderaghi et al. | |
| 5,949,634 A | 9/1999 | Yu | |
| 6,118,154 A | 9/2000 | Yamaguchi et al. | |
| 6,424,013 B1 | 7/2002 | Steinhoff et al. | |
| 6,492,208 B1 | 12/2002 | Cheng et al. | |
| 6,750,517 B1 | 6/2004 | Ker et al. | |
| 7,859,804 B1 * | 12/2010 | Gallerano ........... H01L 27/0262 361/56 |
| 9,299,668 B2 * | 3/2016 | Bourgeat ................ H01L 23/60 |
| 2002/0159208 A1 | 10/2002 | Ker et al. | |
| 2003/0011949 A1 | 1/2003 | Ker et al. | |
| 2003/0052332 A1 * | 3/2003 | Chen ................... H01L 27/0262 257/173 |

(Continued)

FOREIGN PATENT DOCUMENTS

| | | | |
|---|---|---|---|
| FR | 2784503 A1 | 4/2000 |
| FR | 2982416 A1 | 5/2013 |

(Continued)

OTHER PUBLICATIONS

Duvvury, et al., "Substrate Pump NMOS for ESD Protection Applications," Date of Conference: Sep. 26-28, 2000, 12 pages.

(Continued)

Primary Examiner — Ronald W Leja
(74) Attorney, Agent, or Firm — Slater Matsil, LLP

(57) ABSTRACT

A device includes a transistor configured for operating in a hybrid mode, an element configured for generating and injecting a current into the substrate of the transistor in the presence of an ESD pulse, and a thyristor triggerable at least by the element.

27 Claims, 6 Drawing Sheets

(56) References Cited

U.S. PATENT DOCUMENTS

| | | | |
|---|---|---|---|
| 2005/0047042 A1* | 3/2005 | Satou | H01L 27/0262 361/100 |
| 2005/0275031 A1* | 12/2005 | Dournelle | H01L 27/0266 257/355 |
| 2008/0259511 A1 | 10/2008 | Worley | |
| 2009/0040668 A1 | 2/2009 | Chen et al. | |
| 2009/0122452 A1* | 5/2009 | Okushima | H01L 27/0262 361/56 |
| 2010/0001347 A1 | 1/2010 | Sugiura | |
| 2010/0006891 A1* | 1/2010 | Minesaki | H01L 27/0262 257/173 |
| 2011/0235228 A1* | 9/2011 | Salcedo | H02H 9/046 361/111 |
| 2012/0305984 A1 | 12/2012 | Campi, Jr. et al. | |
| 2013/0113017 A1 | 5/2013 | Galy et al. | |
| 2013/0120049 A1* | 5/2013 | Galy | H03K 17/063 327/446 |
| 2013/0141824 A1 | 6/2013 | Bourgeat et al. | |
| 2013/0155558 A1* | 6/2013 | Bourgeat | H01L 23/60 361/56 |
| 2014/0167099 A1* | 6/2014 | Mergens | H01L 29/87 257/109 |
| 2015/0077888 A1* | 3/2015 | Galy | H01L 29/7436 361/56 |

FOREIGN PATENT DOCUMENTS

| | | |
|---|---|---|
| WO | 02075892 A1 | 9/2002 |
| WO | 2010031798 A1 | 3/2010 |

OTHER PUBLICATIONS

Galy, et al., "Ideal Gummel curves simulation of high current gain vertical NPN BIMOS transistor," International Journal of Electronics, Published on Nov. 10, 2010, 11 pages.

* cited by examiner

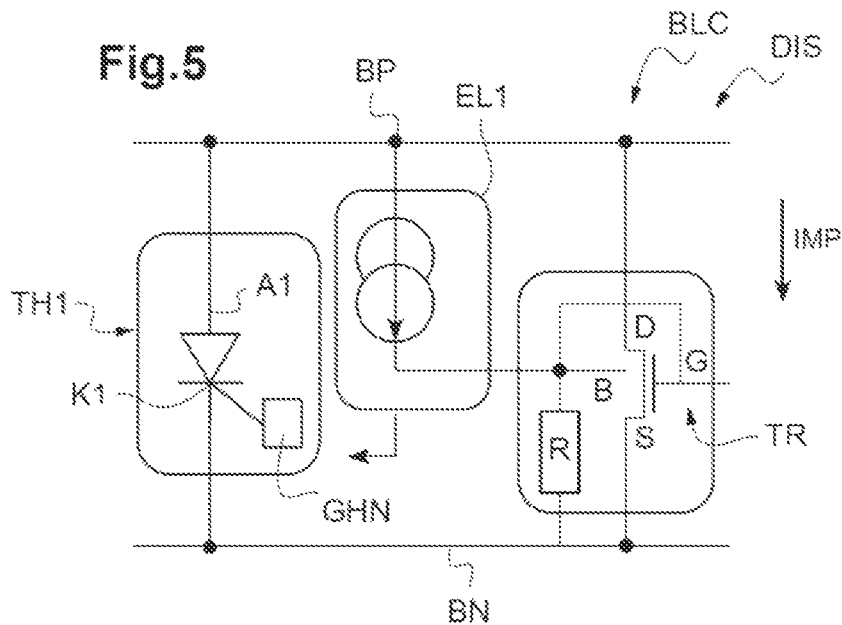
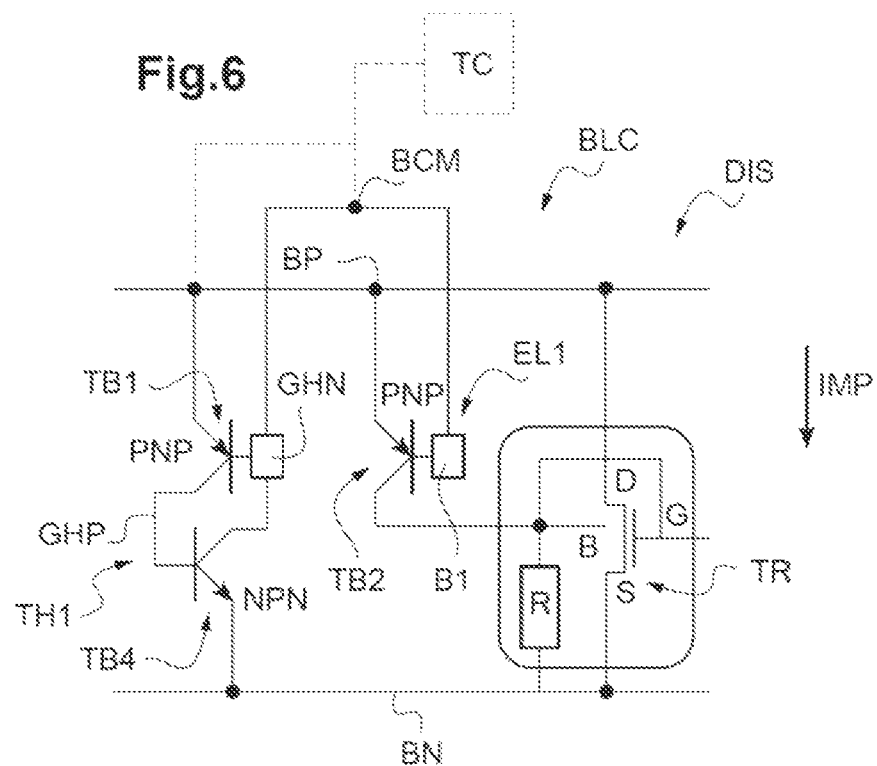

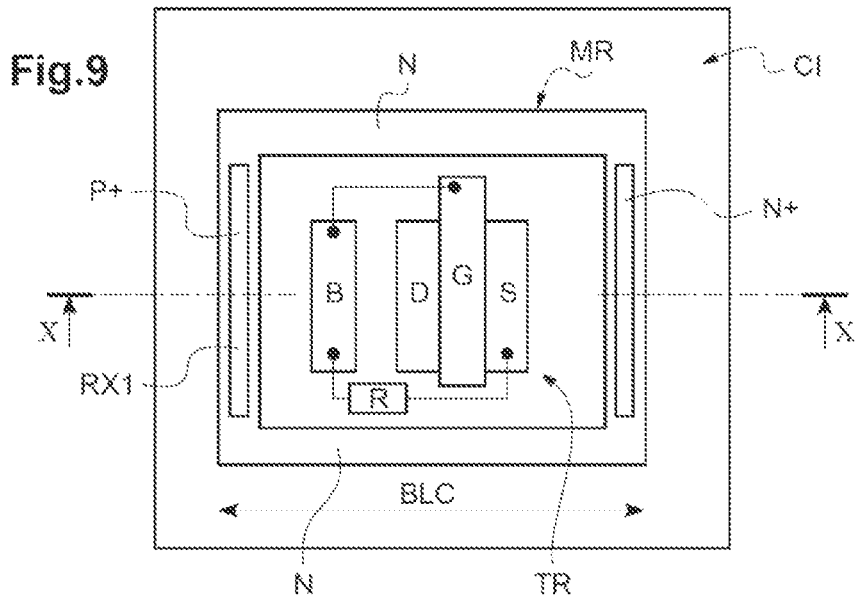
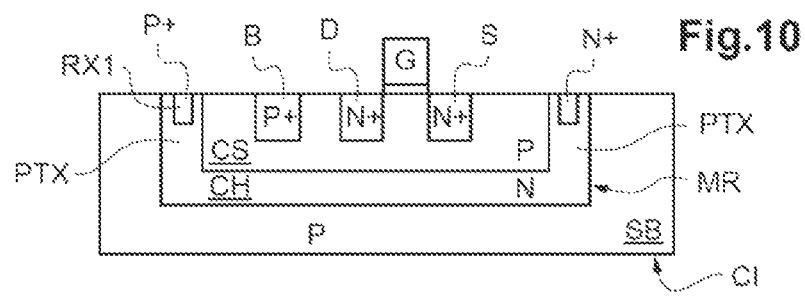
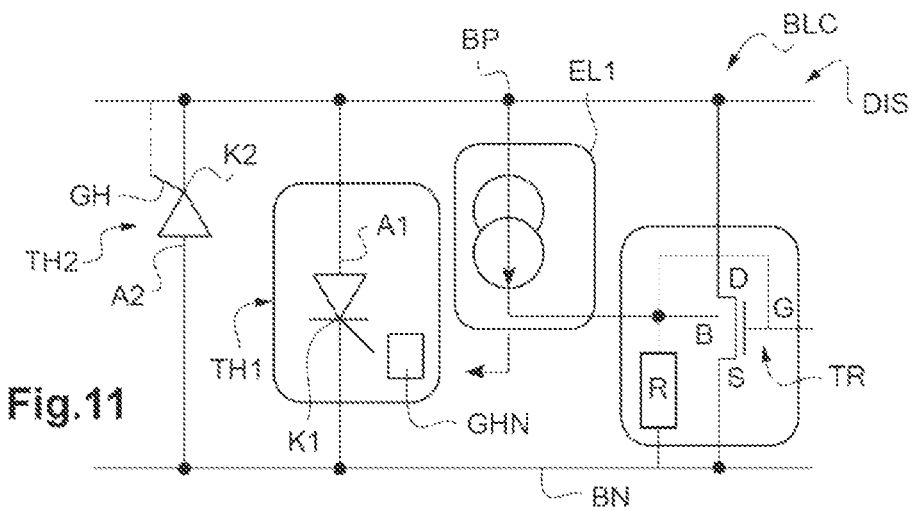

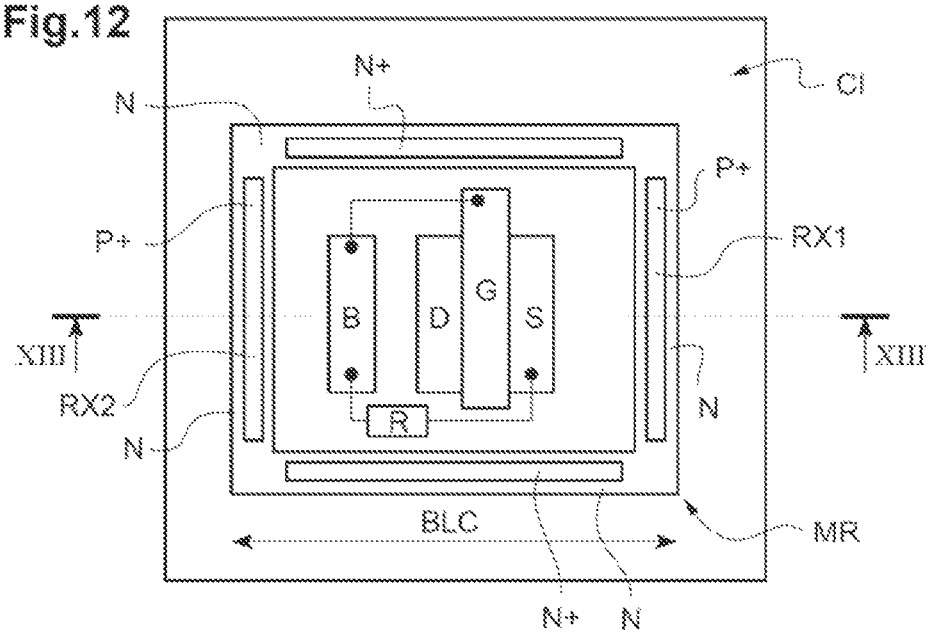
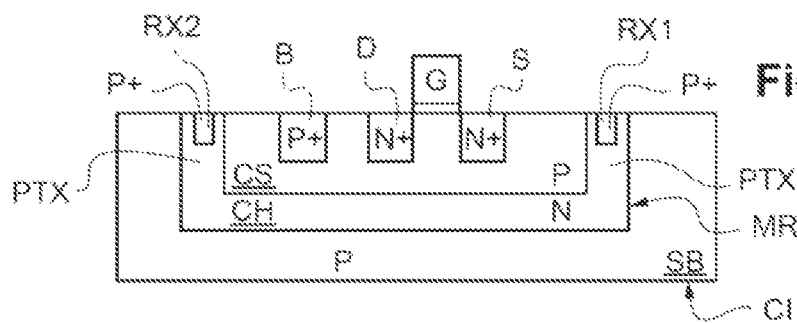
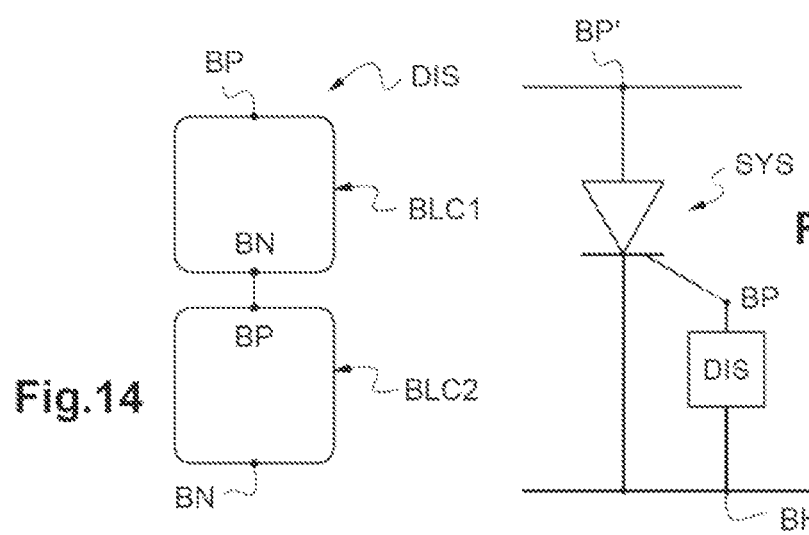

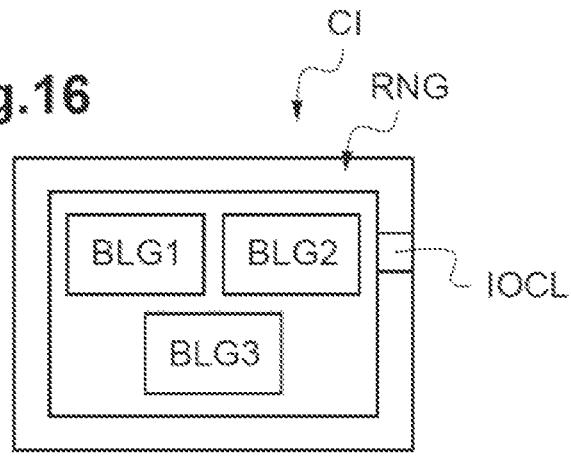
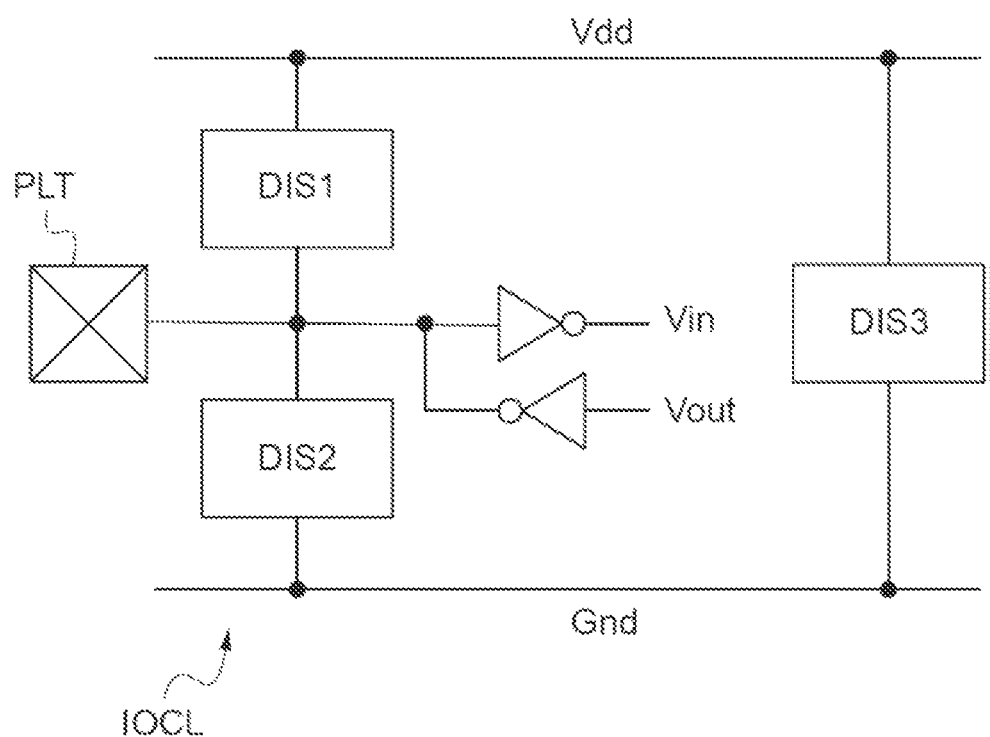

ELECTRONIC DEVICE FOR ESD PROTECTION

This application claims the benefit of French Application No. 1358846, filed on Sep. 13, 2013, which application is hereby incorporated herein by reference.

TECHNICAL FIELD

The invention relates to electronic devices and, in particular embodiments to devices designed for the protection of components against electrostatic discharges (or ESD), but also devices of the "trigger" type (according to a terminology typically used by those skilled in the art) capable of controlling another system, for example a power thyristor.

BACKGROUND

The use of advanced CMOS technologies, for example, the use of technologies less than or equal to 65 nanometers, leads to the use of lower and lower power supply voltages.

In the International Patent Application WO 2011/089179 (and U.S. equivalent patent publication 2013/0141824), an electronic device has been provided that is in particular designed for the protection against electrostatic discharges, and is capable of triggering at voltages lower than those offered by conventional ESD protection based, for example, on transistors whose gate is connected to ground, referred to as "GG NMOS transistors" ("Grounded Gate NMOS transistors"), which allowed the overvoltage across the terminals of the component to be protected to be limited to a lower value.

In this International Patent Application, the electronic protection device was based on the use of an MOS transistor including a parasitic bipolar transistor, configured for operating in a hybrid mode including an operation of the MOS type in a sub-threshold mode and an operation of the parasitic bipolar transistor.

The principle of a hybrid operation of an MOS transistor has been demonstrated in the article by Ph. Galy and V. Berland entitled "Ideal Gummel curves simulation of high current gain vertical NPN BIMOS transistor", INT. J. ELECTRONICS, 1996, vol. 80 No. 6,717-726. This article is a theoretical study carried out on a transistor with a vertical structure having a gate length (channel length) of the order of a micron and validated by simulations, without any particular application of such a hybrid operation being mentioned.

A tetrapodal microelectronic component, combining the bipolar effect and the MOS effect in a hybrid mode of operation in such a manner as to improve the current gain, has also been described in the French Patent Application No. 2 784 503. Such a component is presented as withstanding ionizing radiation and it is stated in a general manner that it may be employed for consumer, spatial and/or military applications, in the digital and analog fields, without a particular application of the hybrid operation of the component being mentioned.

SUMMARY

According to one embodiment, an electronic device is therefore provided, in particular for the protection against electrostatic discharges, that is capable of triggering at even lower voltages while at the same time offering an even lower holding voltage, typically for 32 nanometer CMOS technologies and smaller, whether this be in a bulk substrate technology or in a technology of the silicon-on-insulator (or SOI) type.

According to one embodiment, a solution is provided for combining an MOS transistor configured for operating in a hybrid mode with, on the one hand, an element configured for generating and injecting a signal into the substrate of the MOS transistor in the presence of an ESD pulse, which will promote switching into the hybrid operation of the MOS transistor and will consequently reduce the triggering voltage of the protection device and, on the other hand, with a thyristor triggerable at least by the element, which will allow the holding voltage of the device together with the resistance of the triggered and conducting device (RON) to be reduced.

Such a device may be used as such as a protection device against electrostatic discharges or else as a trigger device ("trigger circuit") capable of controlling another system, for example a power thyristor.

According to one aspect, an electronic device is thus provided comprising a first terminal and a second terminal and electronic circuitry coupled between the two terminals.

According to a general feature of this aspect, the electronic circuitry comprises at least one block as follows. An MOS transistor has a first conduction electrode coupled to the first terminal, a second conduction electrode coupled to the second terminal. The MOS transistor includes a parasitic bipolar transistor and is configured for, in response to a current pulse between the two terminals, operating in a hybrid mode including an operation of the MOS type in sub-threshold mode and an operation of the parasitic bipolar transistor. A first element is coupled between the first terminal and the substrate of the MOS transistor and is configured for generating and injecting current into the substrate of the MOS transistor in the presence of a current pulse propagating from the first terminal to the second terminal. A first thyristor has an anode coupled to the first terminal and a cathode coupled to the second terminal. This first thyristor is triggerable at least by the first element in the presence of the current pulse propagating from the first terminal to the second terminal.

According to one embodiment, the first thyristor has a first gate region, having a first type of conductivity, for example the P type, coupled to an output of the first element, for example, the collector of a bipolar transistor, and to the substrate of the MOS transistor.

According to one embodiment, the first thyristor has a second gate region having a second type of conductivity opposite to the first, for example, the N type. This second gate region can be connected to the first terminal or else left floating. Leaving it floating notably allows a lower triggering voltage to be obtained.

However, the second gate region may be connected to an external trigger circuit, which allows the triggering voltage of the device to be further reduced.

According to one embodiment, the first element comprises a bipolar transistor whose emitter is connected to the first terminal and whose collector is coupled to the substrate of the MOS transistor. In order to further simplify the connection system, the second gate region of the thyristor and the base of the bipolar transistor can be connected together.

Several embodiments are possible for configuring the MOS transistor in such a manner that it operates in a hybrid mode.

Thus, the control electrode of the MOS transistor can be connected to the substrate of the transistor without being connected directly to one of the first and second terminals, and a resistive element can be connected between the substrate of the transistor and the second terminal.

However, if it is desired to have even lower triggering voltages, it is possible to eliminate this resistive element and to keep an MOS transistor having only its gate connected to its substrate, the gate not being connected to the second terminal, for example.

The electronic device can be formed in an integrated manner within an integrated circuit and the block can comprise the following elements. A semiconductor well has a first type of conductivity, for example the P type of conductivity, electrically insulated from an external semiconductor substrate by a semiconductor wall having a second type of conductivity opposite to the first, for example, the N type of conductivity. The MOS transistor comprises a first and a second semiconductor region within the well respectively forming the first and second conduction electrodes and the well forming the substrate of the transistor. A first auxiliary semiconductor region is located within the semiconductor wall having the first type of conductivity and connected to the first terminal. The auxiliary semiconductor region, the semiconductor wall and the well form the first element. The auxiliary semiconductor region, the semiconductor wall, the well and the second semiconductor region form the first thyristor.

Thus, it is noteworthy to observe that, by simply inserting an auxiliary semiconductor region having the first type of conductivity within the semiconductor wall and by conserving the remainder of the topology used to only form an MOS transistor configured for operating in a hybrid mode, the combination of the MOS transistor, of the first element and of the first thyristor is very simply implemented.

A particularly compact topology encompassing these three components is thus obtained.

In addition, according to one embodiment, the semiconductor wall forms the second gate region of the thyristor and the base of the bipolar transistor which forms the first element.

The semiconductor well, on the other hand, advantageously forms the collector of the bipolar transistor forming the first element together with the first gate region of the first thyristor.

According to one embodiment, the first auxiliary semiconductor region extends in the direction of the width of the MOS transistor next to one of the electrode semiconductor regions of the MOS transistor.

Thus, this first auxiliary semiconductor region can be situated next to the source or else next to the drain of the MOS transistor.

According to one embodiment, the electronic circuitry further comprises a protection circuit connected between the two terminals and configured for short-circuiting the two terminals in the presence of a current pulse this time propagating from the second terminal to the first terminal.

This protection circuit may be an external protection circuit formed by any suitable component.

It can thus comprise an additional thyristor whose anode is connected to the second terminal and whose cathode is connected to the first terminal.

However, it is also very simple to implement it in a particularly compact manner within the block keeping the same topology as previously, but by simply adding a second auxiliary semiconductor region within the semiconductor wall, this second auxiliary semiconductor region also having the first type of conductivity and being connected to the second terminal. In this case, the second auxiliary semiconductor region, the semiconductor wall, the well and the first semiconductor region of the MOS transistor form the additional thyristor.

This second auxiliary semiconductor region can advantageously extend in the direction of the width of the transistor next to the other electrode semiconductor region of the MOS transistor, in other words facing the first auxiliary semiconductor region.

The electronic means can comprise two cascoded blocks.

The device can form a trigger device capable of controlling another system, for example a power thyristor. As a variant, this device can, on its own, form a protection device against electrostatic discharges, the two terminals being intended to be connected to a component to be protected, the first terminal being intended to be connected to a live point of the component and the second terminal being intended to be connected to a neutral point of the component, for example ground.

According to another aspect, an input/output cell of an integrated circuit is provided comprising an input/output lug, a first power supply terminal, a second power supply terminal, a first ESD protection device such as defined hereinbefore coupled between the first power supply terminal and the input/output lug, a second ESD protection device such as defined hereinbefore coupled between the input/output lug and the second power supply terminal, and a third protection device ESD such as defined hereinbefore coupled between the first power supply terminal and the second power supply terminal.

According to another aspect, an integrated circuit is provided comprising at least one input/output cell such as defined hereinbefore.

BRIEF DESCRIPTION OF THE DRAWINGS

Other advantages and features of the invention will become apparent upon examining the detailed description of non-limiting embodiments and of the appended drawings, in which:

FIGS. 5 to 17 illustrate schematically various embodiments of the invention.

DETAILED DESCRIPTION OF ILLUSTRATIVE EMBODIMENTS

Figure 1:
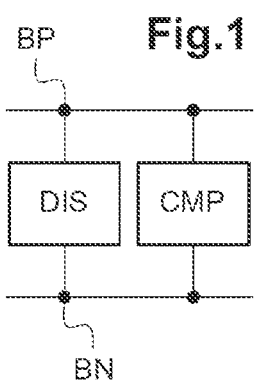
FIG. 1 illustrates very schematically one embodiment of an electronic device according to the invention, usable in particular for the protection of a component against electrostatic discharges.

The International Patent Application WO 2011/089179 and U.S. equivalent patent publication 2013/0141824 have shown that it was particularly advantageous to use the principle of hybrid operation of the transistor notably for the implementation of a device subjected to a current pulse, in particular a device for the protection of a component against electrostatic discharges which result in current pulses between the two terminals of the device owing to a pulsed voltage difference between these two terminals.

This hybrid operation is obtained when the transistor is configured in such a manner that the gate of the MOS transistor is biased with a voltage lower than its threshold voltage and that the substrate-source voltage difference of the MOS transistor is positive. This positive voltage difference is for example obtained when the substrate of the MOS transistor, which forms the intrinsic base of the parasitic bipolar transistor, is biased with a non-zero voltage while the source of the MOS transistor is connected to ground.

As long as the configuration conditions of the transistor are such that this hybrid operation may be obtained, the latter can occur for relatively large gate lengths, for example 1 micron, but nevertheless, in this case, not particularly usable on the industrial scale.

On the other hand, with the development of the technologies, the base of the parasitic bipolar transistor is getting smaller, which is in particular the case for the technologies less than or equal to 65 nanometers, and more particularly for the technologies less than 50 nanometers, affording a greater importance to the parasitic bipolar behavior of the MOS transistor.

It then becomes possible to make significant use, at least in a transient manner at the beginning of the current pulse, of the MOS transistor under its threshold voltage, and simultaneously, to use the operation of the parasitic bipolar transistor.

Furthermore, in such a hybrid operation, the current gain of the bipolar transistor, controlled by the gate voltage of the MOS transistor, may become large and may reach several decades.

Thus, this hybrid operation allows such a device to be usable for the protection against electrostatic discharges with a triggering for low voltages, or else to be used in a device of the trigger type.

Indeed, since the current gain Ic/Ib of the bipolar transistor becomes very large when the gate voltage, being non-zero, remains below the threshold voltage of the MOS transistor, the current flowing through the transistor will, in the presence of a pulse of the ESD type, very quickly reach significantly high values, corresponding to the aforementioned triggering threshold, while at the same time limiting, after this triggering, the voltage across the terminals of the component to be protected to low values.

This hybrid operation of the transistor thus allows a triggering to be obtained that is faster than that obtained with a conventional ESD protection circuit using for example an NMOS transistor whose gate is directly connected to ground (Grounded Gate NMOS transistor) and whose substrate is also directly connected to ground.

It goes without saying that, if, during the pulse, the gate-source voltage of the MOS transistor becomes higher than the threshold voltage of this transistor, the MOS transistor goes from the hybrid operation mode to a mode of operation of the MOS type.

Several embodiments are possible.

Thus, it is possible to leave the substrate and the gate of the MOS transistor floating, or else to connect them together without the gate being directly connected to ground and without the substrate being directly connected to ground. Two nodes are said to be "directly connected" or "directly coupled" when the connection or the coupling between these two nodes is formed without an intermediate component connected or coupled between these two nodes.

Indeed, in this case, the gate and substrate biasing required in order to have a hybrid operation are obtained in the presence of the current pulse by virtue of the drain-substrate and drain-gate capacitances.

More precisely, for CMOS technologies below 1 micron, for example 250 nanometers, and in a much more significant fashion for technologies below 65 nanometers, an MOS transistor having its substrate and its gate floating or else connected together without the gate being directly connected to ground and without the substrate being directly connected to ground, will, at least transiently, go into its hybrid mode of operation in the presence of a current pulse resulting from an electrostatic discharge.

Such embodiments have the advantage of offering bidirectional or reversible electronic means, in other words capable of reacting in a symmetrical manner to positive or negative current pulses. These embodiments are especially, but non-exclusively, applicable to transistors having thick gate oxides, for example of the order of 50 Angstroms.

The triggering threshold of the device may advantageously be controlled by a control circuit, for example comprising at least one resistor, which will contribute to controlling the value of the voltage applied to the substrate and/or the gate of the transistor.

This resistive element can have a first terminal connected to the source of the MOS transistor and a second terminal connected to the substrate and to the gate of the MOS transistor.

Such a control circuit allows the ability to simultaneously combine the bipolar and MOS effects, while at the same time amplifying them and reducing the leakage currents.

It is also possible to obtain a combined effect of the MOS and bipolar effects by using a control circuit for example comprising a first resistive element connected between the source and the substrate of the MOS transistor, and a second resistive element connected between the gate and the source of the MOS transistor.

Aside from the triggering voltage, another important parameter for such a device is the holding voltage, in other words the minimum voltage for the device, having triggered, to remain conducting.

Even if the electronic device described in the aforementioned International Patent Application offers advantages, the development of the technologies keeps leading to lower and lower power supply voltages, which requires the provision of devices for protection against electrostatic discharges offering not only lower and lower triggering voltages but also lower and lower holding voltages.

Embodiments of the present invention will now be described with respect to the figures.

In FIG. 1, the reference DIS denotes an electronic device forming, in this variant embodiment, a device for protection of an electronic component CMP against electrostatic discharges (or ESD). The component CMP is connected to a first terminal BP and to a second terminal BN of the device DIS.

By way of example, when the component CMP is in operation, the terminal BP can be connected to a positive voltage Vp and the terminal BN can be connected to a voltage Vn being negative or equal to zero (ground).

When the component CMP is not in operation, it may be subjected to an electrostatic discharge typically resulting in a very short current pulse (typically a few microseconds) whose current peak is for example of the order of 2 amps and occurs typically after 10 nanoseconds. Typically, this corresponds for example to a pulsed potential difference applied between the terminals BP and BN through a R-L-C equivalent circuit, whose voltage peak occurs after 10 nanoseconds with an intensity of 1 to 4 kVolts HBM, for example 4 kVolts HBM for 2.5 amps.

It is recalled here that the letters HBM are the acronym for "Human Body Model", well known to those skilled in the art in the field of the protection against electrostatic discharges and notably denote an electrical circuit aiming to model an electrostatic discharge delivered by a human being and generally used for testing the sensitivity of devices to electrostatic discharges. This HBM electrical circuit, which is the aforementioned R-L-C equivalent circuit to which a high voltage is applied, notably comprises a capacitor of 100 pF which discharges through a resistance of 1.5 kilo-ohms into the device to be tested. Thus, in the present case, an electrostatic discharge of 4 kilovolts HBM means that a potential difference of 4 kilovolts is applied to the HBM electrical circuit.

This current pulse should then flow through the device DIS and not through the component CMP to be protected.

The device DIS consequently aims to absorb this current pulse and to avoid overvoltages across the terminals of the component CMP.

Figure 2:
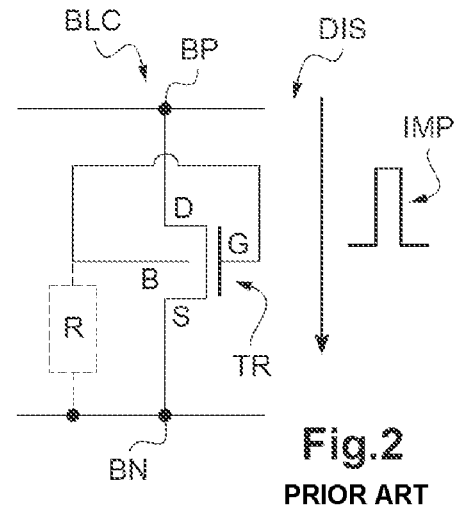
FIGS. 2 to 4 illustrate schematically embodiments of a device of the prior art.

In the prior art, for example described in the aforementioned International Patent Application WO 2011/089179, the device DIS comprises electronic circuitry coupled between the two terminals BP and BN which, as illustrated in particular in FIG. 2, comprise a block BLC comprising an MOS transistor TR, here an NMOS transistor.

The drain D of the transistor TR is coupled to the first terminal BP whereas the source S of this transistor TR is coupled to the second terminal BN.

The transistor TR includes a parasitic bipolar transistor whose collector corresponds to the drain D of the NMOS transistor, whose emitter corresponds to the source S of the MOS transistor, and whose base corresponds to the substrate B of the NMOS transistor.

The transistor TR is configured for, in the presence of a current pulse IMP between the two terminals BP and BN, operating in a hybrid mode which includes an operation of the MOS type in a sub-threshold mode and an operation of the parasitic bipolar transistor.

Thus, the gate-source voltage VGS of the MOS transistor remains lower than the threshold voltage VT of the transistor while a non-zero voltage VBS is applied between the substrate B (or "Bulk" according to a terminology well-known to those skilled in the art) and the source S of the transistor TR so as to activate the parasitic bipolar transistor.

Thus, by applying a voltage to the substrate B of the transistor TR, the parasitic bipolar transistor is activated, while the current gain β of this parasitic bipolar transistor is controlled by means of the voltage applied to the gate of the transistor TR.

In the exemplary embodiment illustrated in FIG. 2, a resistive element R is connected between the substrate B and the source S of the transistor TR.

Furthermore, the gate of the transistor TR is connected to the substrate B.

The electrostatic discharge is transmitted via the drain-substrate capacitance CDB to the substrate of the transistor TR and by the drain-gate capacitance CDG to the gate G of the transistor TR.

The current pulse IMP is transformed by the resistance R into a substrate-source voltage $V_{BS}$ and into a gate-source voltage $V_{GS}$.

The presence of the capacitance $C_{DB}$, which is very large with respect to the capacitance $C_{DG}$, together with the connection between the substrate and the gate of the transistor TR, allows combined and amplified bipolar and MOS effects to be obtained. Indeed, since the capacitance $C_{DB}$ is very large with respect to the capacitance $C_{DG}$, the pulse transmitted to the gate is less intense than that transmitted to the substrate. The presence of the connection between the gate and the substrate allows the gate to acquire a higher bias (by virtue of the pulse transmitted via the capacitance $C_{DG}$ and by virtue of the pulse transmitted to the substrate) and, consequently, to amplify these combined effects, because the closer the gate voltage comes to the threshold voltage of the MOS transistor, the more the current gain increases.

Furthermore, the higher the product of R and $C_{DB}$, the lower the voltage or triggering threshold of the protection device.

Thus, depending on the technology used, notably the value of R will be chosen in order to have an acceptable triggering threshold compatible with a sub-threshold operation of the MOS transistor.

In the presence of a negative electrostatic discharge, in other words giving rise to a positive potential difference between the terminal BN and the terminal BP (giving rise to a current pulse going from the terminal BN to the terminal BP), the drain of the transistor TR is the electrode connected to the terminal BN, the source is the electrode connected to the terminal BP and the current flows, at the start of the pulse, through the resistance R and, when the voltage exceeds the threshold voltage of the diode (around 0.6 volts), through the forward-biased diode of the junction substrate-source of the transistor TR. The resistance R also biases the gate of the transistor TR.

The current pulse is therefore transmitted at the terminal BP.

It should be noted that, at least in a transient manner at the start of the negative pulse, the transistor TR also switches into a hybrid operation mode owing notably to the connection between the substrate B and the gate G.

Under normal operating conditions, in other words when the component to be protected is in operation, the voltage at the terminal BP is for example equal to the power supply voltage Vdd of the integrated circuit, whose value depends on the technology used, whereas the voltage at the terminal BN is for example ground. Since the operating conditions are normal, in other words not in the presence of a current pulse between the two terminals BP and BN, and the drain-substrate diode is reverse biased, the substrate B and the gate G are biased to ground. The transistor TR is therefore turned off and, consequently, the device DIS does not trigger under normal operating conditions.

Figure 3:
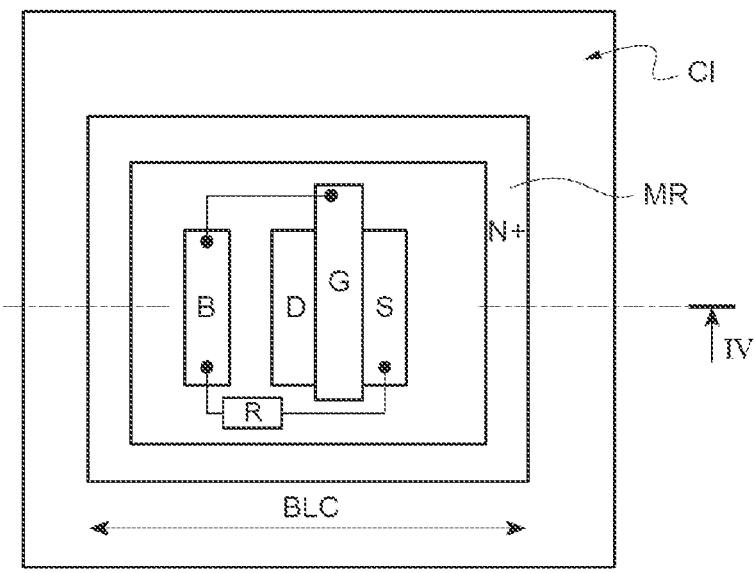
Figure 4:
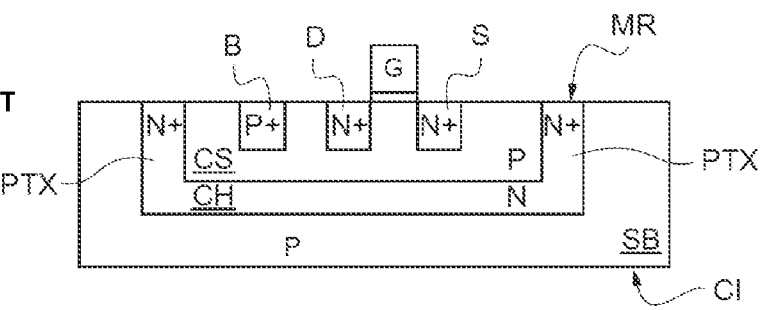

One example of a topology of the device in FIG. 2, within an integrated circuit CI, is illustrated in FIGS. 3 and 4, this latter figure being the cross section along the line IV-IV in FIG. 3.

More precisely, the block BLC comprises a semiconductor well CS having a first type of conductivity, here the P type of conductivity, electrically insulated from an external semiconductor substrate SB by a semiconductor wall MR having a second type of conductivity opposite to the first, here the N type of conductivity.

More precisely, this wall MR comprises a buried layer CH (commonly denoted by those skilled in the art under the acronym NIso) and an annular well PTX (commonly denoted by those skilled in the art under the acronym Nwell). In its upper part, the annular well comprises an implantation N+ so as to promote a good contact.

The MOS transistor comprises a first and a second semiconductor region S and D within the well CS, these zones respectively forming the first and second conduction electrodes of the transistor. The semiconductor source and drain regions are here of the N type of conductivity.

The well CS furthermore forms the substrate (bulk) of the transistor, and a well contact B, doped P+, is formed within the well CS.

The resistance R between the substrate and the source of the transistor may be formed by any resistive element, for example a metallization, a polysilicon line or else by the part of the well CS situated between the well contact B and the source semiconductor region S, without these examples being limiting.

One exemplary embodiment of a device DIS according to the invention is illustrated schematically in FIG. 5.

With respect to the device DIS in FIG. 2, the block BLC of the device DIS in FIG. 5 comprises, aside from the transistor TR configured for operating in a hybrid operation mode, a first element EL1 coupled between the first terminal BP and the substrate B of the MOS transistor, this first element being configured for generating and injecting current into the substrate of the MOS transistor in the presence of a current pulse IMP propagating from the first terminal BP to the second terminal BN.

The block BLC also comprises a first thyristor TH1 whose anode A1 is coupled to the first terminal BP and whose cathode K1 is coupled to the second terminal BN. This thyristor is configured so as to be triggerable at least by the first element EL1 in the presence of the current pulse IMP propagating from the first terminal BP to the second terminal BN.

Although a resistance R has been connected between the substrate B of the transistor TR and the terminal BN, this resistance could be omitted, notably in order to further decrease the triggering voltage of the device DIS.

As can be seen in in FIG. 6, the first element E1 and the thyristor TH1 are advantageously formed by bipolar transistors.

More precisely, the first element EL1 comprises a bipolar transistor PNP referenced TB2 whose emitter is connected to the first terminal BP and whose collector is coupled to the substrate B of the transistor TR.

The first thyristor TH1 comprises two bipolar transistors TB1 and TB4. The bipolar transistor TB1 is a PNP transistor whose emitter is connected to the first terminal BP and whose collector is connected to the base of the transistor TB4 which is a NPN transistor, thus forming a first gate region GHP, of the P type of conductivity. The base of the transistor TB1 is connected to the collector of the transistor TB4 forming a second gate region GHN of the N type of conductivity. Finally, the emitter of the transistor TB4 is connected to the second terminal BN.

In the exemplary embodiment illustrated here, the gate of the N type GHN and the base B1 of the transistor TB2 are connected together so as to form a common terminal BCM. Here, several possibilities are offered.

According to a first possibility, the terminal BCM can be left floating.

According to another possibility, the terminal BCM can be connected to the first terminal BP.

According to a third possibility, the terminal BCM can be connected to an external trigger circuit TC. For this purpose, any type of trigger circuit may be suitable, for example a transistor of the GGNMOS type.

In fact, as far as the triggering voltage of the device DIS is concerned, the worst case scenario is when the terminal BCM is connected to the first terminal BP.

On the other hand, a lower triggering voltage is obtained when the terminal BCM is left floating, and an even lower one when it is connected to the trigger circuit TC.

In this example, the fact that the first thyristor TH1 is triggerable at least by the first element EL1 is obtained by a coupling between the first gate region GHP of the thyristor TH1 and the collector of the bipolar transistor TB2 via a common semiconductor region.

Thus, when a positive pulse IMP, in other words propagating from the first terminal BP to the second terminal BN, occurs, the transistor TR switches into a hybrid operation mode as explained hereinbefore. Virtually simultaneously, the pulse IMP causes an avalanche of the base-collector junction of the bipolar transistor TB2, which in turn causes an injection of current into the semiconductor region common to the collector and to the first gate region GHP. For this reason, the injection of current into this common semiconductor region causes an injection of current into the transistor TB4, which in turns allows the first thyristor TH1 to be triggered.

The first element EL1 has consequently amplified the hybrid operation mode of the transistor TR, thus causing a reduction in the triggering voltage of the device DIS. Furthermore, the triggering of the first thyristor TH1 leads to a reduction in the holding voltage of the device DIS and also to a decrease in its resistance RON in its conducting state.

Although it is possible to form the first element EL1 and the first thyristor TH1 with external components, it is particularly advantageous, as illustrated in FIGS. 7 to 10, to form the first element EL1 and the first thyristor TH1 within the block BLC by a minor modification of the topology used in the prior art for the formation of the transistor TR (FIGS. 3 and 4).

Figure 7:
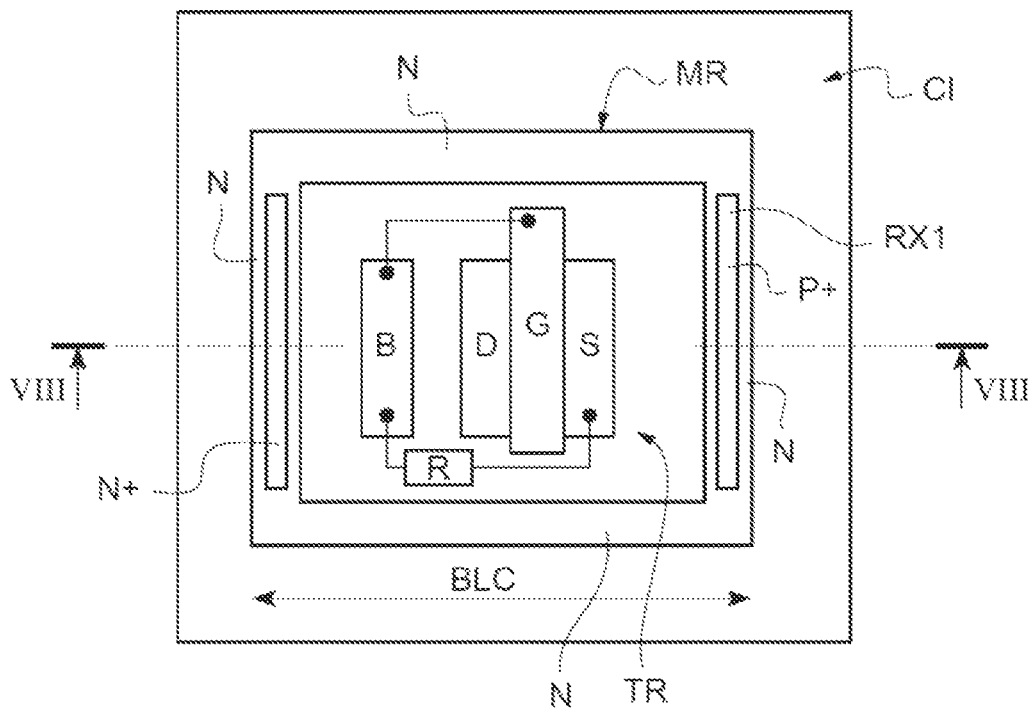
Figure 8:
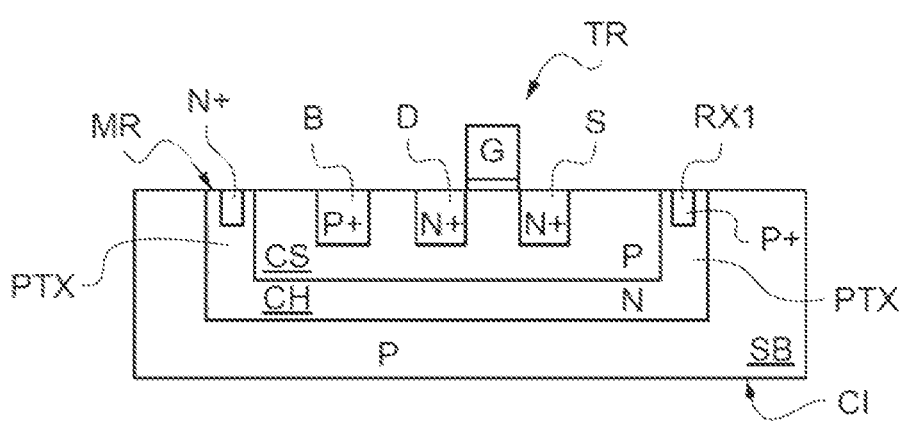

Indeed, as illustrated in FIG. 7, and in FIG. 8 which is the cross section along the line VIII-VIII in FIG. 7, it suffices to form a first auxiliary semiconductor region RX1, of the P type of conductivity, within the semiconductor wall MR of the N type of conductivity in order to form the first element EL1 and the thyristor TH1. In the embodiment in FIG. 7, the first semiconductor region RX1, here doped P+, extends in the direction of the width of the transistor next to the source region S. On the other side of the transistor, an N+ doped region allows an electrical contact to be made on the semiconductor wall MR.

Thus, the bipolar transistor TB2 of the first element EL1 is formed by the first auxiliary region RX1 (P), the insulating wall (N) and the well SC (P). The collector (well P) of the bipolar transistor TB2 is therefore indeed coupled to the substrate (well P) of the transistor TR.

Furthermore, the first auxiliary region RX1 (P), the semiconductor wall MR (N), the well CS (P) and the source region S (N) form the first thyristor TH1 whose anode (region RX1) is connected to the first terminal BP and, consequently, to the drain region D of the transistor (TR) and whose cathode (source region S of the transistor TR) is connected to the second terminal BN. The connection between the auxiliary region RX1 and the terminal BP may be made by a metallization.

Whereas in the embodiment of FIGS. 7 and 8, the auxiliary region RX1 is located close to the source of the transistor, it may also, as a variant, be located, as illustrated in FIG. 9 and in FIG. 10 which is the cross section along the line X-X in FIG. 9, next to the drain D of the transistor TR.

Although, in the latter case, the first thyristor TH1 is formed by the same succession of regions PNPN as in the case where the first region RX1 is situated on the source side, the distance between the first region RX1 and the source semiconductor region of the transistor TR is larger in the embodiment of FIGS. 9 and 10 than in the embodiment of FIGS. 7 and 8.

Consequently, the thyristor TH1 is more efficient in the embodiment of FIGS. 7 and 8 because the anode-cathode distance is shorter.

Comparative simulations have been carried out with various configurations of the protection device DIS in the case of a 28 nanometer CMOS technology.

With a device DIS of the prior art such as that illustrated in FIG. 2, a triggering voltage of around 3.8 volts and a holding voltage of around 3.9 volts are obtained.

In contrast, with a device DIS of the type of that illustrated in FIGS. 7 and 8, in other words with the first region RX1 situated on the drain side, and with the gate region GHN connected to the first terminal BP, a threshold voltage of around 3.2 volts and a holding voltage of around 2 volts are obtained.

With a device DIS such as that illustrated in FIGS. 9 and 10, in other words this time with the first region RX1 situated on the source side, still with a gate GHN connected to the terminal BP, a threshold voltage of around 2 volts and a holding voltage of around 1 volt are obtained.

In all these simulations, the resistance has been taken equal to 10 kilo-ohms. However, this value of resistance could be much higher, for example of the order of several tens of kilo-ohms or even more.

The device DIS illustrated in FIG. 5 does not offer an effective protection against negative electrostatic pulses IMP, in other words propagating from the second terminal BN to the first terminal BP. Indeed, the simulation results have shown that relatively high triggering voltages were then obtained, typically of around 3.5 volts.

One solution could then consist in placing an external reverse-biased diode between the terminals BN and BP, in other words a diode having its anode connected to the terminal BN and its cathode connected to the terminal BP, or else a second thyristor TH2, such as that illustrated in FIG. 11, having its anode A2 connected to the terminal BN, its cathode K2 connected to the terminal BP, and its gate GH potentially connected to the terminal BP or else to another trigger circuit or even left floating.

However, as illustrated in FIGS. 12 and 13, the addition in the semiconductor wall MR of a second semiconductor region RX2 of the P type of conductivity allows this second thyristor TH2 to be formed very easily.

This second auxiliary region RX2 is this time connected to the second terminal BN and the succession of this second auxiliary region RX2 (P), of the semiconductor wall MR (N), of the well CS (P) and of the semiconductor drain region (N) forms the second thyristor TH2.

In the example described in FIGS. 12 and 13, the second semiconductor region RX2 also extends in the direction of the width of the transistor and is situated next to the drain since the first semiconductor region RX1 is, for its part, situated next to the source of the transistor TR.

However, if the region RX1 is situated on the drain side, the region RX2 is then situated on the source side.

Furthermore, in order to be able to ensure a good point of contact on the semiconductor wall MR, N+ contact regions extend in the direction of the length of the transistor in the upper part of the wall MR.

With such a configuration, simulation results have then shown that a triggering voltage of around 1 volt in the case of a negative pulse was obtained.

The device DIS may also comprise several blocks, for example, as illustrated in FIG. 14, two identical cascoded blocks BLC1, BLC2, the second terminal BN of the block BLC1 being connected to the first terminal BP of the block BLC2.

The device DIS which has just been described is used as such as a protection device against electrostatic discharges.

However, as illustrated in FIG. 15, this device DIS can be used as a trigger device for another system SYS, for example a power thyristor.

In this case, the first terminal BP of the device DIS is connected to the trigger of the system SYS.

When an ESD pulse propagates from the terminal BP' to the terminal BN, this current pulse passes through the forward-biased PN junction of the thyristor and arrives on the terminal BP of the device DIS which will be triggered so as to ground the trigger of the power thyristor SYS then causing it to trigger more efficiently.

It is particularly advantageous to incorporate protection devices against electrostatic discharges of the type of those which have just been described into an input-output cell of an integrated circuit.

By way of non-limiting example, such input/output cells IOCL may be disposed, as illustrated in FIG. 16, within a ring RNG on the periphery of the integrated circuit CI.

These cells IOCL can for example communicate power supply voltages and/or data signals going to and/or coming from functional blocks BLG1-BLG3 of the integrated circuit.

As illustrated in FIG. 17, the input-output cell comprises for example an input-output lug PLT for receiving/transmitting a signal. This cell comprises two power supply terminals Vdd and Gnd. A first device DIS1, of the type of that which has just been described hereinbefore, is then disposed between the power supply terminal Vdd and the input-output lug PLT.

A second protection element DIS2 is disposed between the input-output lug PL2 and the second power supply terminal Gnd. Finally, a third ESD protection device DIS3 is disposed between the two power supply terminals Vdd and Gnd.

Thus, such an input-output cell is protected in an extremely simple fashion against an electrostatic discharge occurring between the two power supply terminals Vdd and Gnd, and also against an electrostatic discharge that may occur either between the power supply terminal Vdd and the input-output lug or between the input-output lug and the power supply terminal Gnd. The functional blocks connected between the two terminals Vdd and Gnd are therefore also protected against an electrostatic discharge.

Although, in the examples described hereinbefore, one or more NMOS transistors have been used, the invention is also applicable in a complementary manner to one or more PMOS transistors, with bipolar transistors also modified in a complementary manner.

Furthermore, the invention which has just been described is applicable to any type of integrated technology, whether this be a technology on a bulk substrate or else a technology of the silicon-on-insulator type. In the latter case, the buried layer CH (NISO) is replaced by the buried insulating layer known to those skilled in the art by the term BOX ("Buried OXide").

What is claimed is:

1. An electronic device, comprising:
   a first terminal;
   a second terminal;
   a MOS transistor formed in a substrate and having a first conduction electrode coupled to the first terminal and a second conduction electrode coupled to the second terminal and including a parasitic bipolar transistor, the MOS transistor configured to, in the presence of a current pulse between the first and second terminals, operate in a hybrid mode including an operation of the MOS type in a sub-threshold mode and an operation of the parasitic bipolar transistor;
   a first element coupled between the first terminal and the substrate of the MOS transistor and configured for generating and injecting current into the substrate of the MOS transistor in the presence of a current pulse propagating from the first terminal to the second terminal; and a first thyristor including an anode coupled to the first terminal and a cathode coupled to the second terminal, the first thyristor triggerable at least by the first element in the presence of the current pulse propagating from the first terminal to the second terminal.

2. The device according to claim 1, wherein the first thyristor has a first gate region having a first type of conductivity coupled to an output of the first element and to the substrate of the MOS transistor.

3. The device according to claim 2, wherein the first thyristor has a second gate region having a second type of conductivity, opposite to the first conductivity, coupled to the first terminal or left floating.

4. The device according to claim 2, wherein the first thyristor has a second gate region having a second type of conductivity, opposite to the first conductivity, the device further comprising a trigger circuit is coupled to the second gate region of the first thyristor.

5. The device according to claim 4, wherein the first element comprises a bipolar transistor with an emitter coupled to the first terminal and a collector coupled to the substrate of the MOS transistor and wherein the second gate region of the first thyristor and a base of the bipolar transistor are coupled together.

6. The device according to claim 1, wherein the first element comprises a bipolar transistor with an emitter coupled to the first terminal and a collector coupled to the substrate of the MOS transistor.

7. The device according to claim 1, wherein a control electrode of the MOS transistor is coupled to the substrate of the transistor without being directly connected to one of the first and second terminals.

8. The device according to claim 7, further comprising a resistive element coupled between the substrate of the transistor and the second terminal.

9. The device according to claim 1, wherein the device comprises two cascoded blocks.

10. The device according to claim 1, wherein the device forms a trigger device capable of controlling another system.

11. The device according to claim 1, wherein the device forms a protection device against electrostatic discharges, the first and second terminals being intended to be coupled to a component to be protected, the first terminal intended to be coupled to a live point of the component and the second terminal intended to be coupled to a neutral point of the component.

12. An input/output cell for an integrated circuit, comprising:
an input/output lug;
a first power supply terminal
a second power supply terminal;
a first device according to claim 1 coupled between the first power supply terminal and the input/output lug;
a second device according to claim 1 coupled between the input/output lug and the second power supply terminal; and
a third device according to claim 1 coupled between the first power supply terminal and the second power supply terminal.

13. The integrated circuit comprising at least one input/output cell according to claim 12.

14. An electronic device, comprising:
a first terminal;
a second terminal;
a first MOS transistor formed in a substrate and having a first conduction electrode coupled to the first terminal and a second conduction electrode coupled to the second terminal and including a first parasitic bipolar transistor, the first MOS transistor configured to, in the presence of a current pulse between the first and second terminals, operate in a hybrid mode including an operation of the MOS type in a sub-threshold mode and an operation of the first parasitic bipolar transistor;
a first element coupled between the first terminal and the substrate and configured to generate and inject current into the substrate in the presence of a current pulse propagating from the first terminal to the second terminal;
a first thyristor including a first anode coupled to the first terminal and a first cathode coupled to the second terminal, the first thyristor triggerable at least by the first element in the presence of the current pulse propagating from the first terminal to the second terminal;
a third terminal electrically connected to the second terminal;
a fourth terminal;
a second MOS transistor formed in the substrate and having a third conduction electrode coupled to the third terminal and a fourth conduction electrode coupled to the fourth terminal and including a second parasitic bipolar transistor, the second MOS transistor configured to, in the presence of a current pulse between the third and fourth terminals, operate in a hybrid mode including an operation of the MOS type in a sub-threshold mode and an operation of the second parasitic bipolar transistor;
a second element coupled between the third terminal and the substrate and configured to generate and inject current into the substrate in the presence of a current pulse propagating from the third terminal to the fourth terminal; and
a second thyristor including a second anode coupled to the third terminal and a second cathode coupled to the fourth terminal, the second thyristor triggerable at least by the second element in the presence of the current pulse propagating from the third terminal to the fourth terminal.

15. The device according to claim 14, wherein the first thyristor has a first gate region having a first type of conductivity coupled to an output of the first element and to the substrate and wherein the second thyristor has a first gate region having a first type of conductivity coupled to an output of the second element and to the substrate.

16. The device according to claim 14, wherein a control electrode of the first MOS transistor is coupled to the substrate without being directly connected to either of the first and second terminals; and
wherein a control electrode of the second MOS transistor is coupled to the substrate without being directly connected to either of the third and fourth terminals.

17. The device according to claim 16, further comprising a resistive element coupled between the substrate of the transistor and the second terminal.

18. An electronic device, comprising:
a first terminal;
a second terminal;
an MOS transistor formed in a substrate and having a first conduction electrode coupled to the first terminal and a second conduction electrode coupled to the second terminal and including a parasitic bipolar transistor, the MOS transistor configured to, in the presence of a current pulse between the first and second terminals, operate in a hybrid mode including an operation of the MOS type in a sub-threshold mode and an operation of the parasitic bipolar transistor;

a first element coupled between the first terminal and the substrate of the MOS transistor and configured for generating and injecting current into the substrate of the MOS transistor in the presence of a current pulse propagating from the first terminal to the second terminal;

a first thyristor including an anode coupled to the first terminal and a cathode coupled to the second terminal, the first thyristor triggerable at least by the first element in the presence of the current pulse propagating from the first terminal to the second terminal;

a semiconductor well having a first type of conductivity electrically insulated from an external semiconductor substrate by a semiconductor wall having a second type of conductivity, opposite a first conductivity type, the MOS transistor comprising a first and a second semiconductor region within the well respectively forming the first and second conduction electrodes, the well forming the substrate of the transistor; and a first auxiliary semiconductor region located within the semiconductor wall and having the first type of conductivity and coupled to the first terminal;

wherein the first auxiliary semiconductor region, the semiconductor wall and the well form the first element; and wherein the first auxiliary semiconductor region, the semiconductor wall, the well and the second semiconductor region form the first thyristor.

19. The device according to claim 18, wherein the first thyristor has a first gate region having the first type of conductivity coupled to an output of the first element and to the substrate of the MOS transistor;

wherein the first thyristor has a second gate region having the second type of conductivity, opposite to the first conductivity, the device further comprising a trigger circuit is coupled to the second gate region of the first thyristor;

wherein the first element comprises a bipolar transistor with an emitter coupled to the first terminal and a collector coupled to the substrate of the MOS transistor;

wherein the second gate region of the first thyristor and a base of the bipolar transistor are coupled together; and wherein the semiconductor wall forms the second gate region of the thyristor and the base of the bipolar transistor forms the first element.

20. The device according to claim 18, wherein the first thyristor has a first gate region, having the first type of conductivity, coupled to an output of the first element and to the substrate of the MOS transistor;

wherein the first element comprises a bipolar transistor with an emitter coupled to the first terminal and a collector coupled to the substrate of the MOS transistor; and wherein the semiconductor well forms the collector of the bipolar transistor forming the first element and the first gate region of the first thyristor.

21. The device according to claim 18, wherein the first auxiliary semiconductor region extends in a direction of a width of the MOS transistor next to one of the electrode semiconductor regions of the MOS transistor.

22. The device according to claim 21, wherein the first semiconductor region forms a drain of the MOS transistor and the second semiconductor region forms a source of the MOS transistor, and the first auxiliary semiconductor region is located next to the source.

23. The device according to claim 21, wherein the first semiconductor region forms a drain of the MOS transistor and the second semiconductor region forms a source of the MOS transistor, and the first auxiliary semiconductor region is located next to the drain.

24. An electronic device, comprising:
a first terminal;
a second terminal;
an MOS transistor formed in a substrate and having a first conduction electrode coupled to the first terminal and a second conduction electrode coupled to the second terminal and including a parasitic bipolar transistor, the MOS transistor configured to, in the presence of a current pulse between the first and second terminals, operate in a hybrid mode including an operation of the MOS type in a sub-threshold mode and an operation of the parasitic bipolar transistor;

a first element coupled between the first terminal and the substrate (B) of the MOS transistor and configured for generating and injecting current into the substrate of the MOS transistor in the presence of a current pulse propagating from the first terminal to the second terminal;

a first thyristor including an anode coupled to the first terminal and a cathode coupled to the second terminal, the first thyristor triggerable at least by the first element in the presence of the current pulse propagating from the first terminal to the second terminal; and a protection circuit coupled between the first and second terminals and configured to short-circuit the first and second terminals in the presence of a current pulse propagating from the second terminal to the first terminal.

25. The device according to claim 24, wherein the protection circuit comprises an additional thyristor with an anode coupled to the second terminal and with a cathode coupled to the first terminal.

26. The device according to claim 25, wherein the device comprises a second auxiliary semiconductor region located within a semiconductor wall, having a first type of conductivity, coupled to the second terminal, the second auxiliary semiconductor region, the semiconductor wall, the well and the first semiconductor region forming the additional thyristor.

27. The device according to claim 26, wherein the device comprises:
a semiconductor well having a first type of conductivity electrically insulated from an external semiconductor substrate by a semiconductor wall having a second type of conductivity, opposite a first conductivity type, the MOS transistor comprising a first and a second semiconductor region within the well respectively forming the first and second conduction electrodes, the well forming the substrate of the transistor; and a first auxiliary semiconductor region located within the semiconductor wall and having the first type of conductivity and coupled to the first terminal;

wherein the first auxiliary semiconductor region, the semiconductor wall and the well form the first element;

wherein the first auxiliary semiconductor region, the semiconductor wall, the well and the second semiconductor region form the first thyristor;

wherein the first auxiliary semiconductor region extends in the direction of a width of the MOS transistor next to one of the electrode semiconductor regions of the MOS transistor; and wherein the second auxiliary semiconductor region extends in the direction of the width of the MOS transistor next to the other electrode semiconductor region of the MOS transistor.

\* \* \* \* \*